United States Patent
Shen (10) Patent No.: US 11,646,673 B2
(45) Date of Patent: May 9, 2023

(54) VOLTAGE SUPPLY CIRCUIT AND POWER SUPPLY UNIT DELIVERING CONSTANT POWER

(71) Applicant: Ark Semiconductor Corp. Ltd., Shenzhen (CN)

(72) Inventor: Yi-Lun Shen, Taipei (TW)

(73) Assignee: Ark Semiconductor Corp. Ltd., Shenzhen (CN)

( * ) Notice: Subject to any disclaimer, the term of this patent is extended or adjusted under 35 U.S.C. 154(b) by 123 days.

(21) Appl. No.: 17/209,154

(22) Filed: Mar. 22, 2021

(65) Prior Publication Data

US 2022/0200474 A1 Jun. 23, 2022

(30) Foreign Application Priority Data

Dec. 23, 2020 (TW) .................................. 109145712

(51) Int. Cl.
*H02M 7/217* (2006.01)
*H02M 1/00* (2006.01)
(Continued)

(52) U.S. Cl.
CPC ......... *H02M 7/217* (2013.01); *H02M 1/0006* (2021.05); *H02M 1/10* (2013.01);
(Continued)

(58) Field of Classification Search
CPC ............ H02M 7/00; H02M 7/02; H02M 7/04; H02M 7/12; H02M 7/155; H02M 7/217;
(Continued)

(56) References Cited

U.S. PATENT DOCUMENTS 8,456,143 B2    6/2013  Nakashima
9,362,843 B2    6/2016  Eum
(Continued)

FOREIGN PATENT DOCUMENTS

CN    104052315 A    9/2014
CN    105529799 B    12/2018
(Continued)

OTHER PUBLICATIONS

English translation of JP-2011244602-A. (Year: 2011).*

*Primary Examiner* — Thienvu V Tran
*Assistant Examiner* — Carlos O Rivera-Perez
(74) *Attorney, Agent, or Firm* — Winston Hsu (57) ABSTRACT

A voltage supply circuit includes a rectifier circuit, a charging circuit, a feedback circuit and an energy storage circuit. The rectifier circuit is used to receive an input voltage to generate a rectified energy. The charging circuit is coupled to the rectifier circuit and has a modulation input terminal and an energy supply terminal. The modulation input terminal is used to receive a modulation voltage, and the energy supply terminal is used to selectively output a charging current according to the modulation voltage. The feedback circuit is used to receive a high voltage signal and a supply voltage, and output the modulation voltage to the modulation input terminal. The feedback circuit is used to adjust the modulation voltage according to a difference between the supply voltage and a reference voltage. The energy storage circuit is charged by the charging current to pull up the supply voltage.

18 Claims, 5 Drawing Sheets

(51) Int. Cl.
*H02M 1/10* (2006.01)
*H03F 3/21* (2006.01)
*G05F 1/66* (2006.01)

(52) U.S. Cl.
CPC .................. *H03F 3/21* (2013.01); *G05F 1/66* (2013.01); *H02M 1/0003* (2021.05)

(58) Field of Classification Search
CPC ............. H02M 7/2176; H02M 1/0003; H02M 1/0006; H02M 1/0012; H02M 1/0025; H02M 1/08; H02M 1/082; H02M 1/088; H02M 1/10; H02M 1/36; H02M 3/02; H02M 3/04; H02M 3/10; H02M 3/135; H02M 3/137; H02M 3/139; H02M 3/155; H02M 3/156; H02M 3/157; H02M 3/22; H02M 3/24; H02M 3/315; H02M 3/335; H02M 3/33507; H02M 3/33515; H02M 3/33523; H02M 3/3353; H02M 3/33538; H02M 3/33546; H02M 3/33553; H03F 3/20; H03F 3/21; H03F 2200/129; H03F 2200/151; H03F 2200/18; H03F 2200/219; H03F 1/34; G05F 1/10; G05F 1/46; G05F 1/461; G05F 1/462; G05F 1/465; G05F 1/468; G05F 1/56; G05F 1/561; G05F 1/562; G05F 1/563; G05F 1/575; G05F 1/595; G05F 1/66

USPC ..... 363/21.04–21.18, 34, 37, 44–49, 73, 74, 363/89, 123–127; 323/222–226, 266, 323/268–275, 282–287, 304, 311–317, 323/351, 901

See application file for complete search history.

(56) References Cited

U.S. PATENT DOCUMENTS

| | | | |
|---|---|---|---|
| 2005/0237035 A1* | 10/2005 | Reilly | G05F 1/66 323/208 |
| 2010/0148735 A1* | 6/2010 | Napravnik | G05F 1/575 323/280 |
| 2010/0148736 A1* | 6/2010 | Napravnik | G05F 1/575 323/280 |
| 2010/0283442 A1 | 11/2010 | Nakashima | |
| 2014/0160808 A1 | 6/2014 | Sato | |
| 2017/0288440 A1 | 10/2017 | Ye | |
| 2017/0338811 A1* | 11/2017 | Li | H03K 19/0016 |
| 2019/0252983 A1 | 8/2019 | Tian | |

FOREIGN PATENT DOCUMENTS

| | | |
|---|---|---|
| CN | 109905042 A | 6/2019 |
| JP | 2011244602 A * | 12/2011 |
| JP | 6092604 | 3/2017 |
| TW | I556545 B | 11/2016 |
| TW | I674741 B | 10/2019 |
| WO | 2009/078271 A1 | 6/2009 |

* cited by examiner

VOLTAGE SUPPLY CIRCUIT AND POWER SUPPLY UNIT DELIVERING CONSTANT POWER

CROSS REFERENCE TO RELATED APPLICATION

This non-provisional application claims priority of Taiwan patent application No. 109145712, filed on 23 Dec. 2020, included herein by reference in its entirety.

BACKGROUND OF THE INVENTION

1. Field of the Invention

The invention relates to a power supply device, and in particular, to a power supply circuit and a power supply capable of delivering a constant power.

2. Description of the Prior Art

A power supply is a device for converting an alternating current (AC) power into a stable low-voltage direct current (DC) power and providing the DC power for use in electronic appliances. When the AC power is provided by the electrical grid, the AC voltage of the power supply is generally between 100V and 250V, and the DC power may provide a stable supply voltage such as 21V, 12V, 5V, or 3.3V. In the related art, a transformer is utilized to step down a high-voltage AC power into a low-voltage AC power, and then convert the low-voltage AC power into a DC voltage. Due to the large size of the transformer, the size of the power supply unit cannot be reduced. In addition, in order to provide a wide range of the supply voltage, the withstand voltage required by the transformer will be increased, resulting in an increase in the size of a high-withstand voltage components and an increase in the size of the power supply unit. Therefore, the large sizes of the power supplies in the related art pose difficulty in the design of portable devices or small electronic appliances.

SUMMARY OF THE INVENTION

According to an embodiment of the invention, a power supply circuit includes a rectifier circuit, a charging circuit, a feedback circuit and an energy storage circuit. The rectifier circuit is used to receive an input voltage to generate a rectified energy. The charging circuit is coupled to the rectifier circuit, has a modulation input terminal and an energy supply terminal, and is used to selectively output a charging current at the energy supply terminal according to a modulation voltage, and generate a high voltage signal according to the rectified energy. The modulation input terminal is used to receive a modulation voltage. The charging current is negatively correlated to the modulation voltage. The energy storage circuit is coupled to the energy supply terminal of the power source, and is used to be charged by the charging current to pull up the supply voltage. The feedback circuit is coupled to the modulation input terminal, and is used to receive the high voltage signal and the supply voltage at the energy supply terminal, and output the modulation voltage to the modulation input terminal. The feedback circuit is used to adjust the modulation voltage according to the high voltage signal in a positive correlated manner.

According to another embodiment of the invention, a power supply circuit includes a rectifier circuit, a charging circuit, a feedback circuit and an energy storage circuit. The rectifier circuit, the feedback circuit and the energy storage circuit are coupled to the charging circuit. A method of operating the power supply circuit includes the rectifier circuit receiving an input voltage to generate a rectified energy; the charging circuit generating a high voltage signal according to the rectified energy; the feedback circuit adjusting a modulation voltage in a positive correlation manner according to the high voltage signal; the charging circuit selectively outputting a charging current according to the modulation voltage; and when the charging circuit outputs the charging current, charging the energy storage circuit with the charging current to pull up a supply voltage. The charging current is negatively correlated to the modulation voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
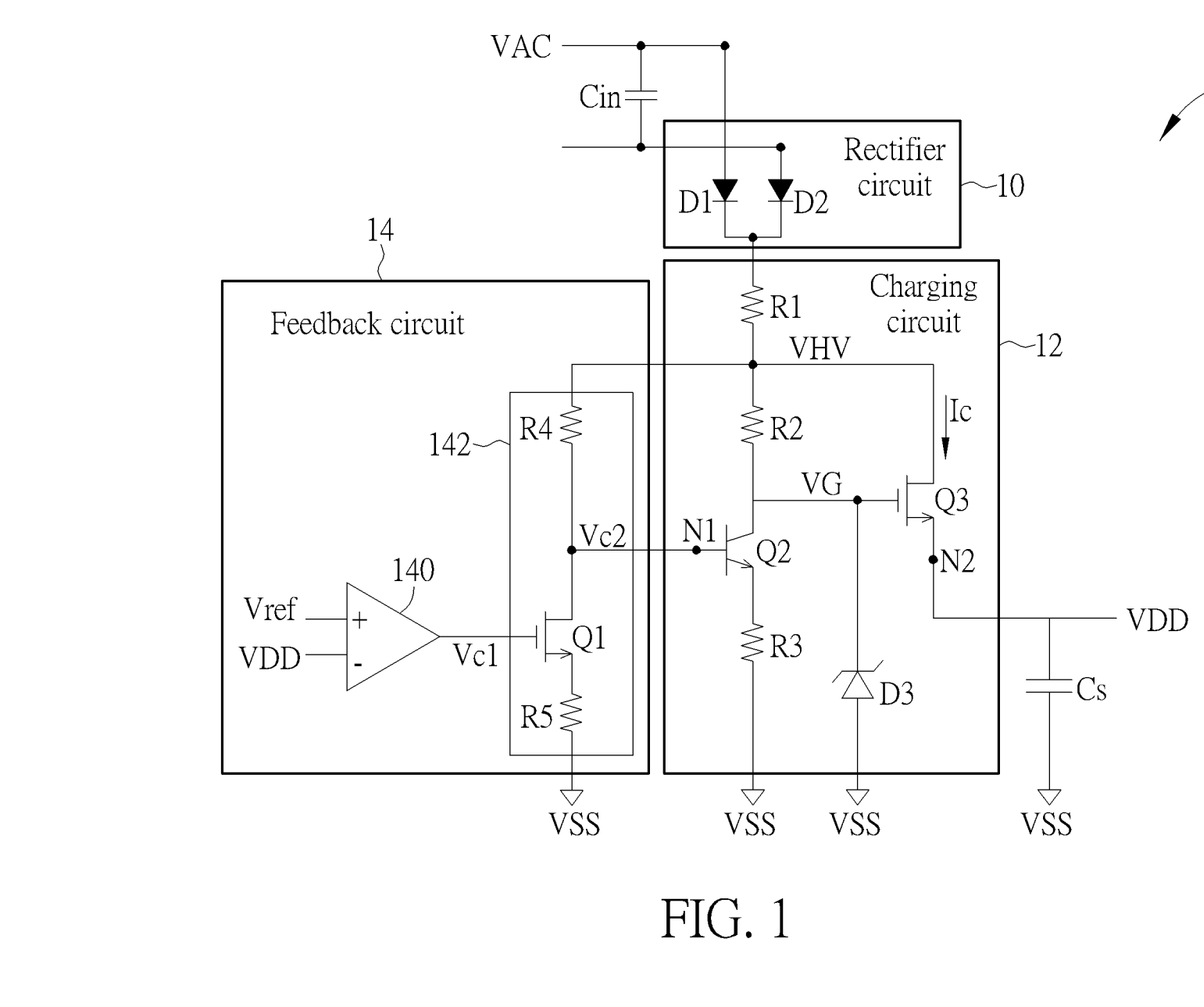
FIG. 1 is a circuit schematic of a power supply circuit according to an embodiment of the invention.

FIG. 1 is a block diagram of a power supply circuit 1 according to an embodiment of the invention. The power supply circuit 1 may receive an input voltage VAC and provide a suitable supply voltage VDD according to the input voltage VAC. Specifically, when the input voltage VAC is lower, the power supply circuit 1 may output a higher charging current Ic to increase the supply voltage VDD. When the input voltage VAC is higher, the power supply circuit 1 may output a lower charging current Ic or stop outputting the charging current Ic, so as to slow down or stop charging, and the energy storage circuit Cs continues to discharge and maintain the supply voltage VDD in the operating range. In other words, the power supply circuit 1 may provide a substantially constant power, enhancing the operating efficiency while reducing the circuit area of the power supply circuit 1. The input voltage VAC may be supplied by the electrical grid or other AC voltage sources, and the root mean square may be between 100V and 240V, and the peak voltage may be between 155 and 373V. When the power supply circuit 1 is used in a flyback power supply (flyback transformer), the input voltage VAC may be an auxiliary winding coil voltage of the flyback power supply, the auxiliary winding coil voltage is related to a secondary supply voltage of the flyback power supply by a turns ratio of the transformer windings, and the secondary supply voltage of the flyback power supply may range from 3.3V to 27V. The supply voltage VDD may be a DC voltage, and may be used as a power source for a pulse width modulator (PWM modulator) on the primary side of the flyback power supply. The supply voltage VDD may be set to be higher than 8V.

The power supply circuit 1 may include an input capacitor Cin, a rectifier circuit 10, a charging circuit 12, a feedback circuit 14 and an energy storage circuit Cs. The input capacitor Cin may be coupled to the rectifier circuit 10, the rectifier circuit 10 may be coupled to the charging circuit 12, and the charging circuit 12 may be coupled to the energy storage circuit Cs. The energy storage circuit Cs may be coupled to the feedback circuit 14, and the feedback circuit 14 may be coupled to the charging circuit 12.

The input capacitor Cin may receive the input voltage VAC and filter out a high frequency noise in the input voltage VAC, and the rectifier circuit 10 may rectify the filtered input voltage VAC to generate a rectified energy. The voltage of the rectified energy may be referred to as the rectified voltage. The input capacitor Cin includes a first terminal and a second terminal. The rectifier circuit 10 may include a diode D1 and a diode D2. The diode D1 includes a first terminal coupled to the first terminal of the input capacitor Cin, and a second terminal. The diode D2 includes a first terminal coupled to the second terminal of the input capacitor Cin, and a second terminal coupled to the second terminal of the diode D1.

The charging circuit 12 has a modulation input terminal N1 and an energy supply terminal N2. The modulation input terminal N1 may receive a modulation voltage Vc2, and the energy supply terminal N2 may selectively output the charging current Ic according to the modulation voltage Vc2. The charging current Ic and the modulation voltage Vc2 are negatively correlated. The energy storage circuit Cs may be charged by the charging current Ic to raise the supply voltage VDD at the energy supply terminal N2. The energy storage circuit Cs may include a storage capacitor. The storage capacitor includes a first terminal coupled to the energy supply terminal N2, and a second terminal coupled to a ground terminal. The ground terminal may provide a ground voltage VSS, such as 0V. The supply voltage VDD may be output to an external circuit for power supply. The feedback circuit 14 may receive a high voltage signal VHV and the supply voltage VDD, and output the modulation voltage Vc2 to the modulation input terminal N1. The feedback circuit 14 may adjust the modulation voltage Vc2 according to a difference between the supply voltage VDD and a reference voltage Vref. The difference is generated by subtracting the supply voltage VDD from the reference voltage Vref. For a given high voltage signal VHV, the supply voltage VDD is positively correlated to the modulation voltage Vc2. The reference voltage Vref may be a predetermined voltage level, such as 12V. When the supply voltage VDD increases, the difference between the supply voltage VDD and the reference voltage Vref decreases, and the modulation voltage Vc2 increases. When the supply voltage VDD decreases, the difference between the supply voltage VDD and the reference voltage Vref increases, and the modulation voltage Vc2 decreases.

The charging circuit 12 includes an amplifier circuit Q2, a resistor R1, a resistor R2, a resistor R3, a clamp circuit D3 and an output circuit Q3. The resistor R1 includes a first terminal coupled to the second terminal of the diode D1; and a second terminal. The resistor R2 includes a first terminal coupled to the second terminal of the resistor R1; and a second terminal. The amplifier circuit Q2 includes a control terminal, a first terminal coupled to the second terminal of the resistor R2, and a second terminal. The control terminal of the amplifier circuit Q2 may be the modulation input terminal N1. The resistor R3 includes a first terminal coupled to the second terminal of the amplifier circuit Q2; and a second terminal coupled to the ground terminal. The clamp circuit D3 includes a first terminal coupled to the first terminal of the amplifier circuit Q2; and a second terminal coupled to the ground terminal. The output circuit Q3 includes a control terminal coupled to the first terminal of the clamp circuit D3; a first terminal coupled to the second terminal of the resistor R1; and a second terminal. The second terminal of the output circuit Q3 may be the energy supply terminal N2. The amplifier circuit Q2 may be a first transistor, and the output circuit Q3 may be a second transistor. The first transistor and the second transistor may be N-type metal-oxide-semiconductor field-effect transistors (MOSFET), bipolar junction transistors (BJT) or other types of transistors. In FIG. 1, the amplifier circuit Q2 is an NPN BJT, and the output circuit Q3 is an N-type MOSFET. The clamp circuit D3 may be a Zener diode. The resistor R1, the resistor R2, and the resistor R3 may have fixed resistance.

The feedback circuit 14 may include a control circuit 140 and an impedance path 142. The impedance path 142 may be coupled to the charging circuit 12 and the control circuit 140. The control circuit 140 may be an operational amplifier including a first input terminal configured to receive a reference voltage Vref, a second input terminal configured to receive the supply voltage VDD, and an output terminal configured to generate an amplified voltage Vc1 according to the reference voltage Vref and the supply voltage VDD. The impedance path 142 may include a resistor R4, a variable resistor Q1 and a resistor R5. The resistor R4 includes a first terminal coupled to the second terminal of the resistor R1; and a second terminal. The variable resistor Q1 includes a control terminal coupled to the output terminal of the control circuit 140; a first terminal coupled to the second terminal of the resistor R4; and a second terminal. The resistor R5 includes a first terminal coupled to the second terminal of the variable resistor Q1; and a second terminal coupled to the ground terminal. The variable resistor Q1 may be a third transistor, and the third transistor may be an N-type MOSFET, an NPN BJT or other types of transistors. In FIG. 1, the variable resistor Q1 may be an N-type MOSFET. The resistor R4 and the resistor R5 may have fixed resistance. For a given supply voltage VDD, the high voltage signal VHV is positively correlated to the modulation voltage Vc2.

The amplifier circuit Q2 may generate a first current according to the modulation voltage Vc2. The first current flows from the rectifier circuit 10 through the resistor R1, the resistor R2, the amplifier circuit Q2, and the resistor R3 to the ground terminal, thereby establishing the control voltage VG at the second terminal of the resistor R2. The first current may be the collector current of the amplifier circuit Q2. The control voltage VG is negatively correlated to the high voltage signal VHV and the modulation voltage Vc2. The resistor R1, the resistor R4, the variable resistor Q1, and the resistor R5 may serve as a voltage divider circuit. The modulation resistance of the variable resistor Q1 may be controlled by the amplified voltage Vc1. For a given supply voltage VDD, when the high voltage signal VHV increases, the modulation voltage Vc2 will increase accordingly, and the amplifier circuit Q2 may be turned on more to generate a first current, increasing a voltage drop across the resistor R2 and reducing the control voltage VG. For a given supply voltage VDD, when the high voltage signal VHV decreases, the modulation voltage Vc2 will decrease accordingly, and the amplifier circuit Q2 may be turned on less to generate the first current, decreasing a voltage drop across the resistor R2 and inducing the control voltage VG. In this manner, the high voltage signal VHV and the control voltage VG show a negative correlation. For example, when the high voltage signal VHV exhibits an M-shaped waveform, the modulation voltage Vc2 will show an M-shaped waveform, and the control voltage VG will show a W-shaped waveform. The clamp circuit D3 may limit the control voltage VG to the clamp voltage to protect the output circuit Q3 from being damaged by a high voltage. The clamp voltage may be 30V.

The first terminal of the output circuit Q3 may receive the high voltage signal VHV, and the output circuit Q3 may adjust the charging current Ic flowing therethrough according to the control voltage VG. Specifically, the control terminal of the output circuit Q3 may receive the control voltage VG to selectively generate the charging current Ic. When the control voltage VG is higher than the threshold voltage of the output circuit Q3, the output circuit Q3 will generate the charging current Ic. The charging current Ic is positively correlated to the difference of the control voltage VG and the threshold voltage. When the control voltage VG is less than the threshold voltage of the output circuit Q3, the output circuit Q3 will stop generating the charging current Ic. The charging current Ic may be the drain current of the output circuit Q3. The charging current Ic may charge the energy storage circuit Cs to establish the supply voltage VDD. Therefore, the control voltage VG may control the charging capability of the output circuit Q3.

The feedback circuit 14 may adjust a power extraction window of the power supply circuit 1 to control a time interval for the charging circuit 12 to extract power. The control circuit 140 outputs the amplified voltage Vc1 according to the reference voltage Vref and the supply voltage VDD. The control terminal of the variable resistor Q1 receives the amplified voltage Vc1 to modify the modulation resistance of the variable resistor Q1, thereby adjusting the modulation voltage Vc2 and the control voltage VG. The amplified voltage Vc1 and the modulation resistance are negatively correlated. When the amplified voltage Vc1 increases, the modulation resistance decreases, and the modulation voltage Vc2 decreases, resulting in an increase of the control voltage VG. When the amplified voltage Vc1 decreases, the modulation resistance increases, and the modulation voltage Vc2 increases, resulting in a decrease of the control voltage VG. When the supply voltage VDD is less than the reference voltage Vref, and the control voltage VG is raised to a level higher than the high voltage signal VHV, the power extraction window starts and the output circuit Q3 is turned on to charge the energy storage circuit Cs. When the supply voltage VDD is higher than the reference voltage Vref, the control voltage VG is dropped to less than the high voltage signal VHV, the power extraction window ends, and the output circuit Q3 is turned off to stop charging the energy storage circuit Cs. The longer the time that the control voltage VG is higher than the high voltage signal VHV, the longer the power extraction window will be; the shorter the time that the control voltage VG is lower than the high voltage signal VHV, the shorter the power extraction window will be.

The power supply circuit 1 may output a fixed power and adjust the length of the power extraction window, maintaining the supply voltage VDD in the operating range, while enhancing the operating efficiency and reducing the circuit area.

Figure 2:
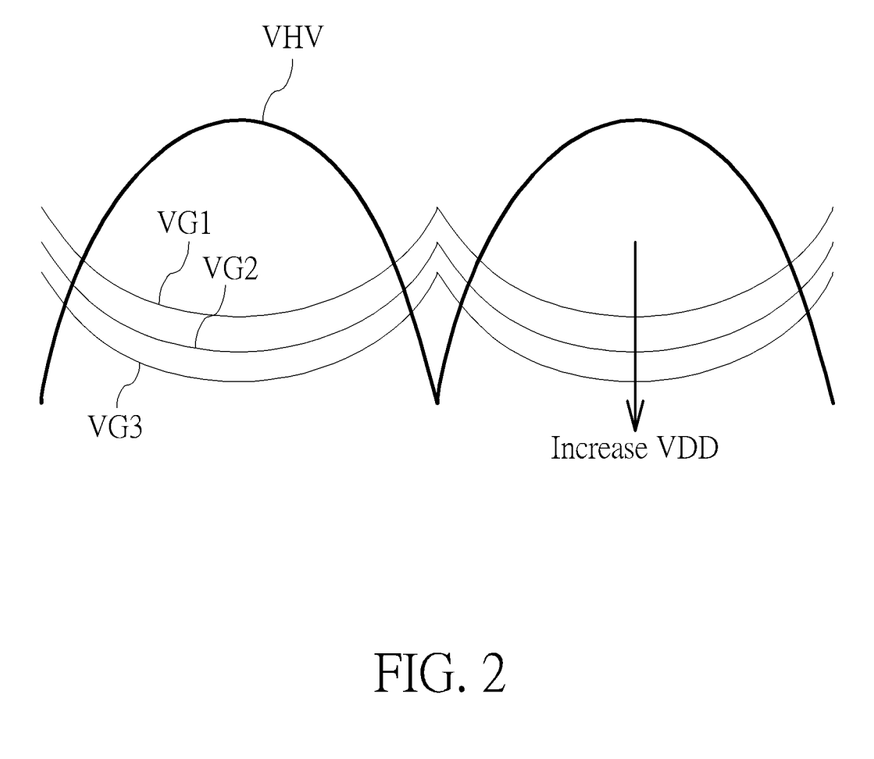
FIG. 2 is a schematic diagram of fixed power extraction and extraction window adjustment of the power supply circuit in FIG. 1.

FIG. 2 is a schematic diagram illustrating the power supply circuit 1 performing a fixed power extraction and an extraction window adjustment. VHV represents the waveform of the high voltage signal VHV, and VG1 to VG3 respectively represent the waveforms of the control voltages VG corresponding to the 3 supply voltages VDD. The waveforms VG1 to VG3 are negatively correlated to the waveform VHV, resulting in a substantially constant power generated by the high voltage signal VHV and the charging current Ic. The lower supply voltage VDD corresponds to the waveform VG1, the middle supply voltage VDD corresponds to the waveform VG2, and the higher supply voltage VDD corresponds to the waveform VG3. When the supply voltage VDD increases, the feedback circuit 14 will lower the control voltage VG to shorten the power extraction window and reduce the charging time of the energy storage circuit Cs. When the supply voltage VDD decreases, the feedback circuit 14 will increase the control voltage VG to increase the power extraction window and increase the charging time of the energy storage circuit Cs.

Figure 3:
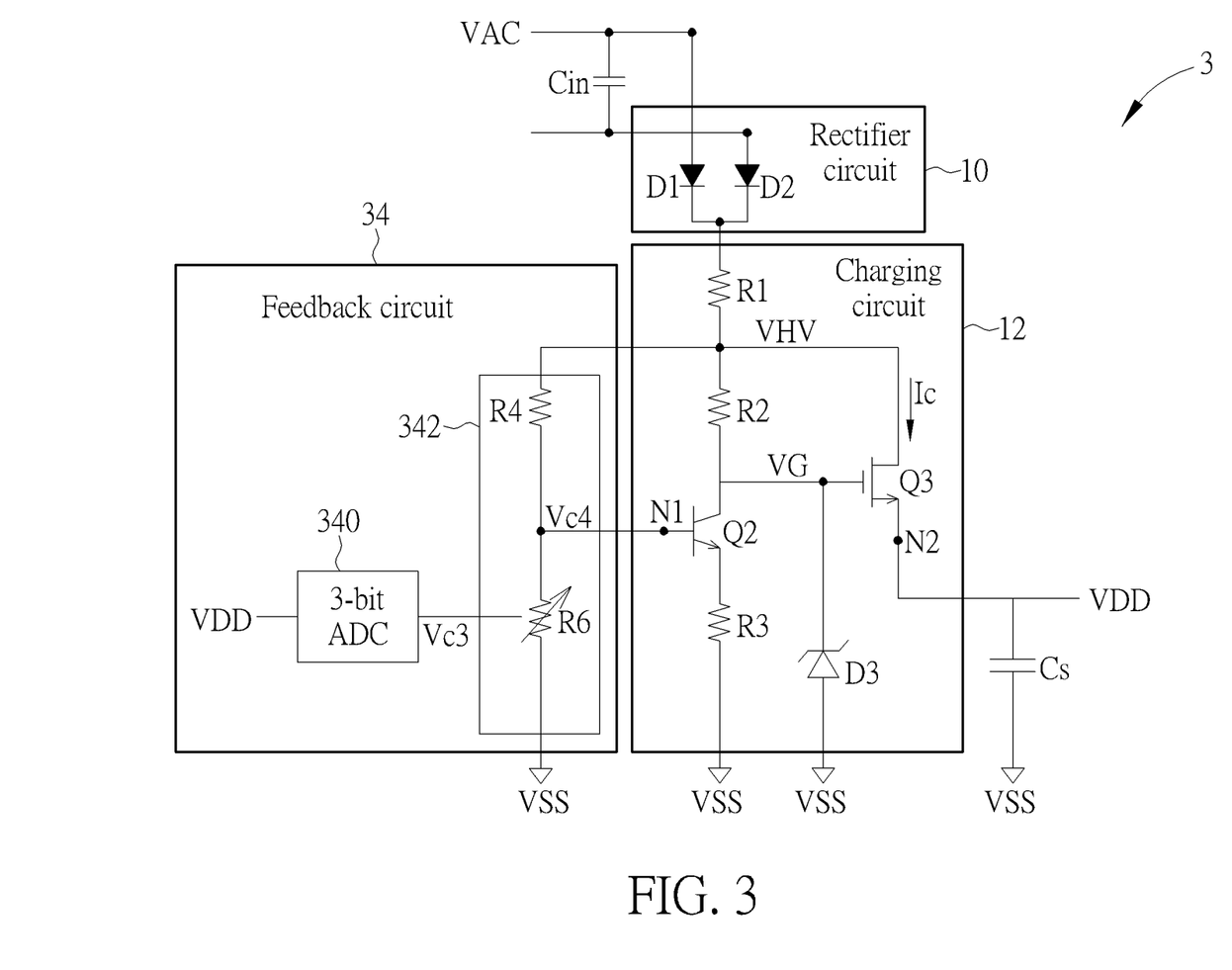
FIG. 3 is a circuit schematic of the power supply circuit according to another embodiment of the invention.

FIG. 3 is a circuit schematic of a power supply circuit 3 according to another embodiment of the invention. The difference between the power supply circuit 3 and the power supply circuit 1 lies in the feedback circuit 34. The feedback circuit 34 will be explained as below. The feedback circuit 34 includes an analog-to-digital converter 340 and an impedance path 342. The impedance path 342 may be coupled to the analog-to-digital converter 340. The analog-to-digital converter 340 may be coupled to the energy storage circuit Cs, and may generate a representative voltage according to the supply voltage VDD, and quantize the representative voltage according to a predetermined signal range to convert the same into a digital signal Vc3. The digital signal Vc3 may be a 3-bit digital signal. For example, the predetermined signal range may be 10V to 12V, and the analog-to-digital conversion circuit 340 may divide the predetermined signal range into 8 levels. When the representative voltage is higher than 12V, the analog-to-digital conversion circuit 182 may generate the maximum value 3b111 of the supply voltage signal Sc. When the representative voltage is less than 10V, the analog-to-digital conversion circuit 182 may generate the minimum value 3b000 of the supply voltage signal Sc. The representative voltage may be an average voltage, a local minimum, a local maximum or the supply voltage VDD at a specific point in time in relation to a preceding power extraction window. For example, the analog-to-digital converter 340 may further include a low-pass filter to generate an average voltage of the supply voltage VDD. In another example, the analog-to-digital converter 340 may further include a sampling circuit to generate the local minimum and the local maximum of the supply voltage VDD. In another example, the analog-to-digital converter 340 may further include a sampling circuit to sample the supply voltage VDD, so as to acquire the supply voltage VDD at a specific point in time after a predetermined delay time from where the power extraction window starts or the power extraction window ends. The predetermined delay time may be longer than or equal to zero. The impedance path 342 may include a resistor R4 and a variable resistor R6. The resistor R4 includes a first terminal coupled to the second terminal of the resistor R1; and a second terminal. The variable resistor R6 includes a control terminal coupled to the analog-to-digital converter 340; a first terminal coupled to the second terminal of the resistor R4; and a second terminal coupled to the ground terminal. The control terminal of the variable resistor R6 may receive the digital signal Vc3 to provide modulation resistance, thereby generating a modulated voltage Vc4. When the supply voltage VDD is lower, the variable resistor R6 will provide a low modulation resistance according to the converted digital signal Vc3, generating a lower modulation voltage Vc4. When the supply voltage VDD is higher, the variable resistor R6 will provide a high modulation resistance according to the converted digital signal Vc3, generating a higher modulation voltage Vc4. The lower modulation voltage Vc4 is less than the higher modulation voltage Vc4.

Compared to the power supply circuit 1 using an analog circuit to realize the feedback circuit 14, the power supply circuit 3 adopts a digital circuit to realize the feedback circuit 34, increasing the stability of the power supply circuit 3, while enhancing the operation efficiency and reducing the circuit area.

Figure 4:
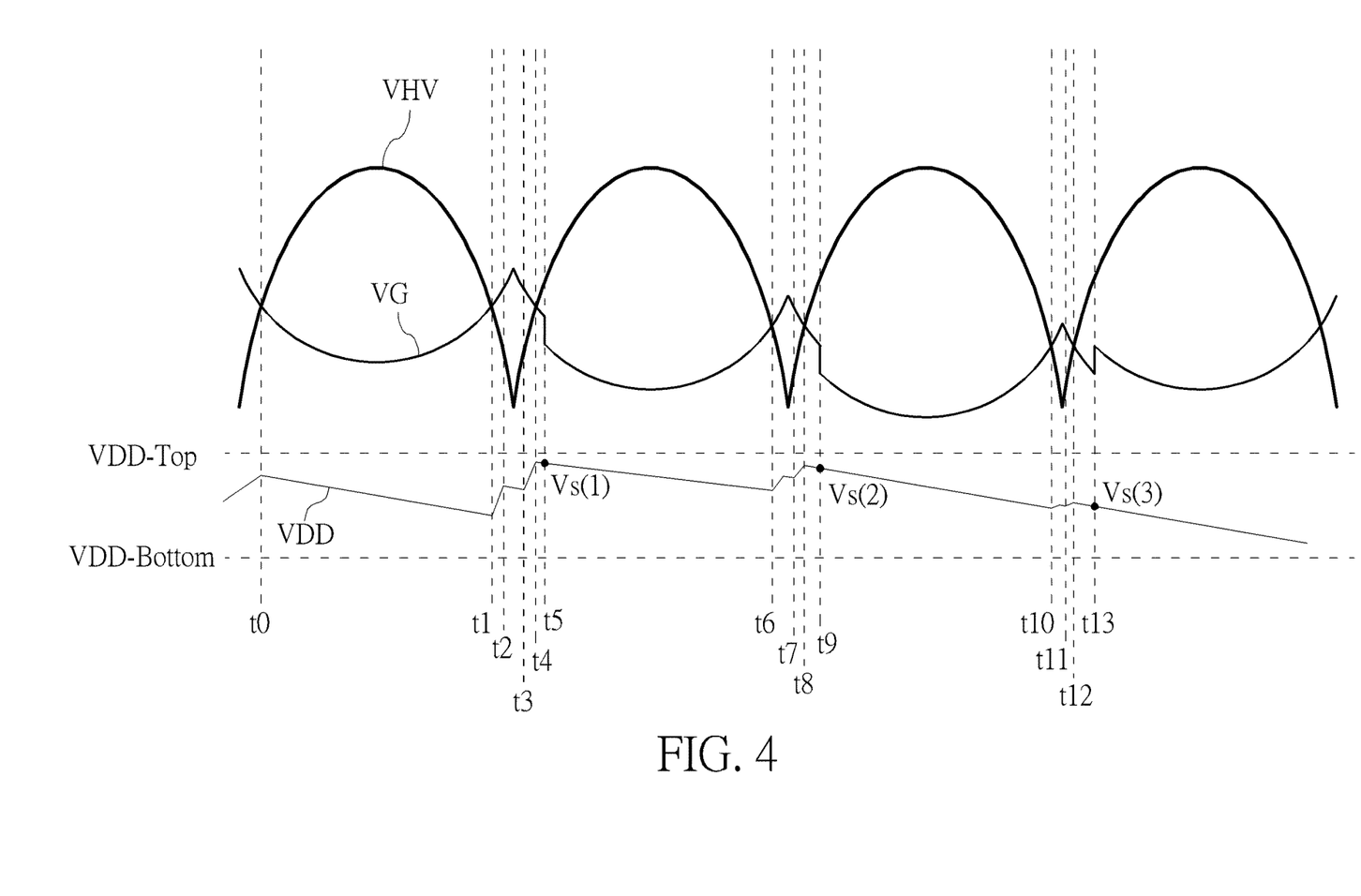
FIG. 4 shows waveforms of signals of the supply circuit in FIG. 3.

FIG. 4 shows waveforms of the power supply circuit 3, including 3 power extraction windows corresponding to 3 time intervals in which the control voltage VG is higher than the high voltage signal VHV. The first power extraction window occurs between Times t1 and t4, the second power extraction window occurs between Times t6 and t8, and the third power extraction window occurs between Times t10 and t12. In the 3 power extraction windows, the charging circuit 12 charges the energy storage circuit Cs, and the supply voltage VDD increases substantially. Outside the 3 power extraction windows, the energy storage circuit Cs is discharged, and the supply voltage VDD decreases. The supply voltage VDD is maintained between the upper limit voltage VDD-Top and the lower limit voltage VDD-Bottom. For example, the upper limit voltage VDD-Top may be 12V, and the lower limit voltage VDD-Bottom may be 10V. Between Times t0 to t1, t4 to t6, and t8 to t10, the control voltage VG is less than the high voltage signal VHV, the output circuit Q3 is turned off, the charging circuit 12 stops charging the energy storage circuit Cs, and the energy storage circuit Cs continues to discharge, lowering the supply voltage VDD.

Between Times t1 and t2, the control voltage VG is higher than the high voltage signal VHV, the output circuit Q3 is turned on, the charging circuit 12 charges the energy storage circuit Cs, the supply voltage VDD rises, and the first power extraction window starts. Between Times t2 and t3, the high voltage signal VHV continues to drop to a level less than the supply voltage VDD provided by the energy storage circuit Cs and becomes unable to charge the energy storage circuit Cs, and therefore, the supply voltage VDD drops. Between Times t3 and t4, the high voltage signal VHV rises after reaching the valley and becomes higher than the supply voltage VDD provided by the energy storage circuit Cs, the high voltage signal VHV resumes charging the energy storage circuit Cs, and the supply voltage VDD increases again. At Time t4, the control voltage VG becomes lower than the high voltage signal VHV, the first power extraction window ends, and the supply voltage VDD reaches the peak. Between Times t4 and t6, the output circuit Q3 is turned off, the charging circuit 12 stops charging the energy storage circuit Cs, and the supply voltage VDD decreases. When a predetermined delay time has elapsed after Time t4, at Time t5, the feedback circuit 34 generates an updated modulation voltage Vc4(1) corresponding to a representative voltage Vs(1) of the supply voltage VDD in the previous period (e.g., Times t0 to t4), the charging circuit 12 reduces the control voltage VG according to the updated modulated voltage Vc4(1) at Time t5.

Between Times t6 and t8, the control voltage VG is higher than the high voltage signal VHV, the output circuit Q3 is turned on, the charging circuit 12 charges the energy storage circuit Cs, the supply voltage VDD rises, and the second power extraction window starts; as the high voltage signal VHV continues to drop to near the valley, the high voltage signal VHV is less than the supply voltage VDD provided by the energy storage circuit Cs and becomes unable to charge the energy storage circuit Cs; and therefore, the supply voltage VDD drops when the high voltage signal VHV is near the valley. At Time t7, the high voltage signal VHV rises after reaching the valley and becomes higher than the supply voltage VDD provided by the energy storage circuit Cs, the high voltage signal VHV resumes charging the energy storage circuit Cs, and the supply voltage VDD increases again. At Time t8, the control voltage VG is lower than the high voltage signal VHV, the second power extraction window ends, and the supply voltage VDD reaches the peak. Between Times t8 and t10, the output circuit Q3 is turned off, the charging circuit 12 stops charging the energy storage circuit Cs, and the supply voltage VDD decreases. When a predetermined delay time has elapsed after Time t8, at Time t9, the feedback circuit 34 again generates an updated modulation voltage Vc4(2) corresponding to a representative voltage Vs(2) of the supply voltage VDD in the previous period (e.g., Times t4 to t8), the charging circuit 12 reduces the control voltage VG according to the updated modulated voltage Vc4(2) at Time t9.

Between Times t10 and t12, the control voltage VG is higher than the high voltage signal VHV, the output circuit Q3 is turned on, the charging circuit 12 charges the energy storage circuit Cs, the supply voltage VDD rises, and the third power extraction window starts; as the high voltage signal VHV continues to drop to near the valley, the high voltage signal VHV is less than the supply voltage VDD provided by the energy storage circuit Cs and becomes unable to charge the energy storage circuit Cs; and therefore, the supply voltage VDD drops when the high voltage signal VHV is near the valley. At Time t11, the high voltage signal VHV rises after reaching the valley and becomes higher than the supply voltage VDD provided by the energy storage circuit Cs, the high voltage signal VHV resumes charging the energy storage circuit Cs, and the supply voltage VDD increases again. At Time t12, the control voltage VG is lower than the high voltage signal VHV, the third power extraction window ends, and the supply voltage VDD reaches the peak. From Time t12 to the start of the next power extraction window, the output circuit Q3 is turned off, the charging circuit 12 stops charging the energy storage circuit Cs, and the supply voltage VDD decreases. When a predetermined delay time has elapsed after Time t12, at Time t13, the feedback circuit 34 again generates an updated modulation voltage Vc4(3) corresponding to a representative voltage Vs(3) of the supply voltage VDD in the previous period (e.g., Times t8 to t12), the charging circuit 12 raises the control voltage VG according to the updated modulated voltage Vc4(3) at Time t13.

Figure 5:
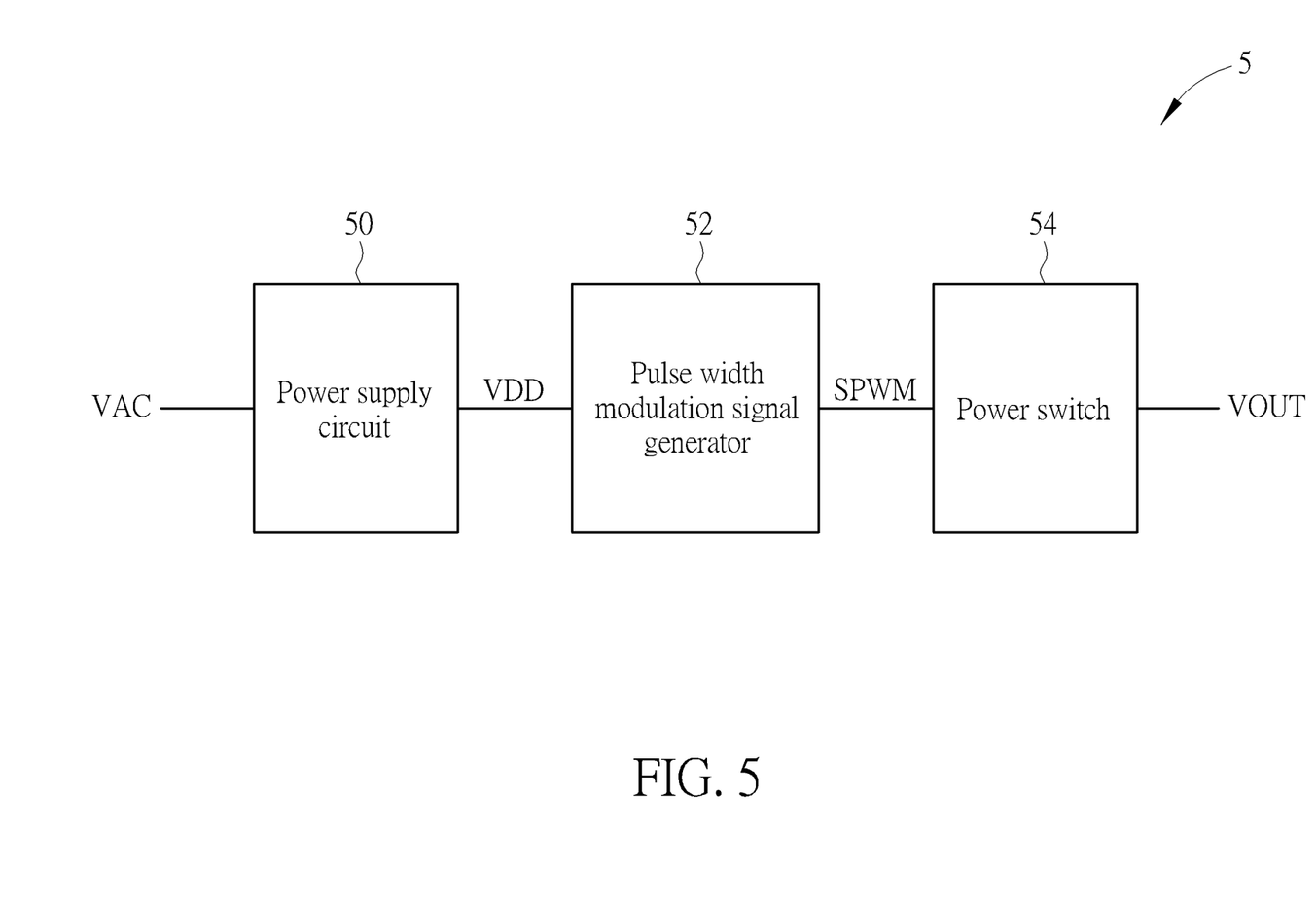
FIG. 5 is a block diagram of a power supply according to an embodiment of the invention.

FIG. 5 is a block diagram of a power supply 5 according to an embodiment of the invention. The power supply 5 includes a power supply circuit 50, a pulse width modulation signal generator 52 and a power switch 54. The power supply circuit 50 may be implemented by the power supply circuit 1 or the power supply circuit 3, providing the supply voltage VDD to the pulse width modulation signal generator 52. The pulse width modulation signal generator 52 is coupled to the energy supply terminal N2 of the supply terminal circuit 50, and may receive the electric energy from the energy supply terminal N2 to maintain the operation of the pulse width modulation signal generator 52 and provide a pulse width modulation signal SPWM to control the power switch 54. In response to the received pulse width modulation signal SPWM, the power switch 54 may be selectively turned on to perform a power conversion, adjusting the duty cycle of the power switch 54 according to the pulse width modulation signal SPWM, so as to adjust the output voltage VOUT of the power supply 5.

The power supply 5 employs the power supply circuit 1 or the power supply circuit 3 to generate the supply voltage VDD, enhancing the operation efficiency while reducing the circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply circuit comprising: a rectifier circuit configured to receive an input voltage to generate a rectified energy; a charging circuit coupled to the rectifier circuit, comprising an output circuit, a modulation input terminal and an energy supply terminal, and configured to selectively output a charging current flowing through the output circuit at the energy supply terminal according to a modulation voltage, and generate a high voltage signal according to the rectified energy, the modulation input terminal being configured to receive the modulation voltage, and the charging current being negatively correlated to the modulation voltage, the output circuit being configured to adjust the charging current according to a control voltage determined by the modulation voltage; an energy storage circuit coupled to the energy supply terminal of the power supply circuit, and configured to be charged by the charging current to pull up a supply voltage presented at the energy supply terminal; and a feedback circuit coupled to the modulation input terminal, and configured to receive the high voltage signal and the supply voltage, adjust the modulation voltage to enable the control voltage to have a first voltage waveform to enable the charging circuit to output the charging current with a first current waveform when the supply voltage is at a first level less than a reference voltage, and adjust the modulation voltage to enable the control voltage to have a second voltage waveform to enable the charging circuit to output the charging current with a second current waveform when the supply voltage is at a second level less than the reference voltage, the first level being lower than the second level, voltages on the first voltage waveform being higher than corresponding voltages on the second voltage waveform, currents on the first current waveform being higher than corresponding currents on the second current waveform, and output the modulation voltage to the modulation input terminal.

2. The power supply circuit of claim 1, wherein the charging circuit further comprises:
an amplifier circuit coupled to an impedance path and configured to generate a first current according to the modulation voltage;
a first resistor coupled to the rectifier circuit;
a second resistor coupled to the first resistor, the impedance path and the amplifier circuit, and configured to establish the control voltage according to the first current, the control voltage being negatively correlated to the modulation voltage; and
a third resistor coupled between the amplifier circuit and a ground terminal; and
the output circuit is coupled to the second resistor and the amplifier circuit.

3. The power supply circuit of claim 2, wherein the charging circuit further comprises a clamp circuit coupled to the second resistor and the amplifier circuit, and configured to limit the control voltage to a clamp voltage.

4. The power supply circuit of claim 2, wherein the amplifier circuit is a first transistor, and the output circuit is a second transistor.

5. The power supply circuit of claim 1, wherein the feedback circuit is configured to adjust the modulation voltage in a positively correlated manner according to the supply voltage when the supply voltage is less than the reference voltage.

6. The power supply circuit of claim 5, wherein the feedback circuit comprises:
a control circuit configured to output an amplified voltage according to a difference, the difference being generated by subtracting the supply voltage from the reference voltage;
an impedance path coupled to the charging circuit to receive the rectified energy, and the impedance path comprising:
a variable resistor having a first terminal coupled to the charging circuit, a second terminal coupled to a ground terminal, and a control terminal configured to receive the amplified voltage to provide a modulation resistance, the amplified voltage being negatively correlated to the modulation resistance;
wherein, when the amplified voltage increases, the modulation resistance decreases and the modulation voltage decreases, and when the amplified voltage decreases, the modulation resistance increases and the modulation voltage increases.

7. The power supply circuit of claim 6, wherein the impedance path further comprises a fourth resistor and a fifth resistor; the fourth resistor has a first terminal coupled to the charging circuit, and a second terminal coupled to the variable resistor; and the fifth resistor is coupled between the second terminal of the variable resistor and the ground terminal.

8. The power supply circuit of claim 6, wherein the control circuit is an operational amplifier comprising a first input terminal configured to receive the reference voltage, a second input terminal configured to receive the supply voltage, and an output terminal configured to generate the amplified voltage.

9. The power supply circuit of claim 1, wherein the feedback circuit comprises:
an analog-to-digital converter coupled to the energy storage circuit, and configured to generate a representative voltage according to the supply voltage, and convert the representative voltage into a digital signal;
an impedance path coupled to the charging circuit, and configured to receive the high voltage signal, the impedance path comprising:
a variable resistor having a first terminal coupled to the charging circuit, a second terminal, and a control terminal configured to receive the digital signal to provide a modulation resistance; and
wherein, when the supply voltage is low, the variable resistor provides a lower modulation resistance according to the digital signal, and the modulation voltage is lower; and
wherein, when the supply voltage is high, the variable resistor provides a higher modulation resistance according to the digital signal, and the modulation voltage is higher.

10. A power supply comprising:
the power supply circuit of claim 1;

a power switch configured to be selectively turned on to perform a power conversion, so as to regulate an output voltage of the power supply; and a pulse width modulation signal generator coupled to the energy supply terminal and the power switch, and configured to receive the supply voltage from the energy supply terminal to maintain an operation of the pulse width modulation signal generator, and provide a pulse width modulation signal to control the power switch.

11. A method of operating a power supply circuit, the power supply circuit comprising a rectifier circuit, a charging circuit, a feedback circuit and an energy storage circuit, the charging circuit comprising an output circuit and an energy supply terminal, the rectifier circuit, the feedback circuit and the energy storage circuit being coupled to the charging circuit, the method comprising: the rectifier circuit receiving an input voltage to generate a rectified energy; the charging circuit generating a high voltage signal according to the rectified energy; the charging circuit selectively outputting a charging current flowing through the output circuit according to a modulation voltage, the charging current being negatively correlated to the modulation voltage; the output circuit adjusting the charging current according to a control voltage determined by the modulation voltage; when a supply voltage is at a first level less than a reference voltage, the feedback circuit adjusting the modulation voltage to enable the control voltage to have a first voltage waveform to enable the charging circuit to output the charging current with a first current waveform; when the supply voltage is at a second level less than the reference voltage, the feedback circuit adjusting the modulation voltage to enable the control voltage to have a second voltage waveform to enable the charging circuit to output the charging current with a second current waveform, the first level being lower than the second level, voltages on the first voltage waveform being higher than corresponding voltages on the second voltage waveform, currents on the first current waveform being higher than corresponding currents on the second current waveform; and when the charging circuit outputs the charging current, charging the energy storage circuit with the charging current to pull up the supply voltage presented at the energy supply terminal.

12. The method of claim 11, wherein the charging circuit selectively outputting the charging current according to the modulation voltage comprises:

the charging circuit generating a first current according to the modulation voltage;

the charging circuit establishing the control voltage according to the first current, the control voltage being negatively correlated to the modulation voltage; and the charging circuit outputting the charging current according to the control voltage.

13. The method of claim 12, wherein:

the charging circuit comprises an amplifier circuit;

the charging circuit generating the first current according to the modulation voltage comprises the amplifier circuit generating the first current according to the modulation voltage; and the charging circuit establishing the control voltage according to the first current comprises the amplifier circuit establishing the control voltage according to the first current.

14. The method of claim 13, wherein:

the charging circuit comprises a clamp circuit coupled to the amplifier circuit; and the method further comprises the clamp circuit limiting the control voltage to a clamp voltage.

15. The method of claim 11, wherein:

the feedback circuit adjusting the modulation voltage in a positive correlation manner according to the supply voltage when the supply voltage is less than the reference voltage.

16. The method of claim 15, wherein the feedback circuit comprises a control circuit and an impedance path coupled to the control circuit, the impedance path comprises a variable resistor, and the feedback circuit adjusting the modulation voltage in the negative correlated manner according to the difference between the reference voltage and the supply voltage comprises:

the control circuit outputting an amplified voltage in a positive correlated manner according to a difference, the difference being generated by subtracting the supply voltage from the reference voltage;

the variable resistor providing a modulation resistance according to the amplified voltage, the amplified voltage being negatively correlated to the modulation resistance; and the variable resistor adjusting the modulation voltage according to the modulation resistance;

wherein, when the amplified voltage increases, the modulation resistance decreases, and the modulation voltage decreases; and when the amplified voltage drops, the modulation resistance increases and the modulation voltage increases.

17. The method of claim 15, wherein the feedback circuit comprises an analog-to-digital converter and an impedance path coupled to the control circuit, the impedance path comprises a variable resistor, and the feedback circuit adjusting the modulation voltage in a positive correlation manner according to the supply voltage comprises:

the analog-to-digital converter generating a representative voltage according to the supply voltage;

converting the representative voltage into a digital signal;

the variable resistor providing a modulation resistance according to the digital signal; and the variable resistor adjusting the modulation voltage according to the modulation resistance;

wherein, when the supply voltage is low, the variable resistor provides a lower modulation resistance according to the converted digital signal, and the modulation voltage is lower; and wherein, when the supply voltage is high, the variable resistor provides a higher modulation resistance according to the converted digital signal, and the modulation voltage is higher.

18. The method of claim 11, wherein a power supply comprises the power supply circuit, a power switch and a pulse width modulation signal generator, the pulse width modulation signal generator being coupled between the power supply circuit and the power switch, the method further comprising:

maintaining the operation of the pulse width modulation signal generator according to the supply voltage output by the power supply circuit for the pulse width modulation signal generator to provide a pulse width modulation signal; and selectively turning on the power switch to perform a power conversion, so as to regulate an output voltage of the power supply.

* * * * *